United States Patent
Carlson

(10) Patent No.: US 7,217,953 B2
(45) Date of Patent: May 15, 2007

(54) TECHNIQUE FOR SUPPRESSION OF EDGE CURRENT IN SEMICONDUCTOR DEVICES

(75) Inventor: Lars S. Carlson, Del Mar, CA (US)

(73) Assignee: Digirad Corporation, Poway, CA (US)

( * ) Notice: Subject to any disclaimer, the term of this patent is extended or adjusted under 35 U.S.C. 154(b) by 232 days.

(21) Appl. No.: 10/953,508

(22) Filed: Sep. 28, 2004

(65) Prior Publication Data

US 2005/0173774 A1    Aug. 11, 2005

Related U.S. Application Data

(60) Continuation of application No. 10/214,791, filed on Aug. 7, 2002, now Pat. No. 6,798,034, which is a division of application No. 09/839,874, filed on Apr. 20, 2001, now Pat. No. 6,667,182.

(60) Provisional application No. 60/198,913, filed on Apr. 20, 2000.

(51) Int. Cl.
*H01L 29/00* (2006.01)
*H01L 31/00* (2006.01)

(52) U.S. Cl. .................. 257/73; 257/233; 257/292; 257/E27.133; 257/E25.032; 438/92

(58) Field of Classification Search ............ 257/73, 257/233, 292, E27.133, E25.032; 438/92, 438/FOR. 173
See application file for complete search history.

(56) References Cited

U.S. PATENT DOCUMENTS

| | | |
|---|---|---|
| 3,874,936 A | 4/1975 | D'Hervilly et al. |
| 4,079,358 A * | 3/1978 | Arntz .................. 365/118 |
| 4,533,933 A | 8/1985 | Pellegrini et al. |
| 4,536,658 A | 8/1985 | Ludington et al. |
| 4,638,551 A * | 1/1987 | Einthoven ............. 438/530 |
| 4,649,626 A * | 3/1987 | Leong .................. 438/164 |
| 4,672,412 A | 6/1987 | Wei et al. |
| 5,116,463 A | 5/1992 | Lin et al. |
| 5,324,981 A | 6/1994 | Kobiki et al. |
| 5,434,094 A | 7/1995 | Kobiki et al. |
| 5,547,879 A | 8/1996 | Dierschke et al. |

(Continued)

FOREIGN PATENT DOCUMENTS

JP    58-202578    11/1983

(Continued)

*Primary Examiner*—Michelle Estrada
*Assistant Examiner*—Nicholas J. Tobergte
(74) *Attorney, Agent, or Firm*—Fish & Richardson P.C.

(57) ABSTRACT

A passive mechanism suppresses injection, into any active guard regions interposed between the edge of a photodiode array chip and the outer photodiode pixels or into the outer pixels themselves, of minority carrier current generated in the physically disrupted region at the edge of the semiconductor die created by cleaving, sawing or otherwise separating the chip from the remainder of the wafer on which the die was fabricated. A thin metallic layer covers all or part of the edge region, thereby creating a Schottky barrier. This barrier generates a depletion region in the adjacent semiconductor material. The depletion region inherently creates an energy band distribution which preferentially accelerates minority carriers generated or near the metal-semiconductor interface towards the metal, thereby suppressing collection of these carriers by any active regions of the guard structure or by the photodiode pixels.

17 Claims, 1 Drawing Sheet

U.S. PATENT DOCUMENTS

| | | |
|---|---|---|
| 5,793,047 A | 8/1998 | Kobayashi et al. |
| 5,961,741 A | 10/1999 | Park et al. |
| 6,051,468 A * | 4/2000 | Hshieh .................. 438/270 |
| 6,066,883 A | 5/2000 | Hosier et al. |
| 6,271,060 B1 | 8/2001 | Zandman et al. |
| 6,677,182 B2 | 1/2004 | Carlson et al. |
| 6,798,034 B2 | 9/2004 | Carlson et al. |

FOREIGN PATENT DOCUMENTS

| | | |
|---|---|---|
| JP | 02-015652 A | 1/1990 |
| JP | 11-355510 | 3/2000 |
| WO | WO 01/82360 | 11/2001 |

* cited by examiner

TECHNIQUE FOR SUPPRESSION OF EDGE CURRENT IN SEMICONDUCTOR DEVICES

CROSS-REFERENCE TO RELATED APPLICATION

This application is a continuation of U.S. application Ser. No. 10/214,791, Aug. 7, 2002 now U.S. Pat. No. 6,798,034, which is a divisional of U.S. application Ser. No. 09/839,874, filed Apr. 20, 2001 now U.S. Pat. No. 6,667,182, which claims benefit of the priority of U.S. Provisional Application Ser. No. 60/198,913, filed Apr. 20, 2000, and entitled "Technique For Suppression of Edge Current in Semiconductor Devices." The disclosures of the above applications are incorporated herein by reference as part of this application.

TECHNICAL FIELD

The present invention relates to electromagnetic radiation detectors, and more specifically to electromagnetic radiation detectors, particularly backside-illuminated semiconductor photodiode arrays.

BACKGROUND

A typical photodiode array includes a semiconductor substrate of a first conductivity type, having a front side formed with an array of doped regions of a second, opposite conductivity type, and an opposing back side that includes a heavily-doped bias electrode layer of the first conductivity type. For simplicity, the frontside doped regions are referred to below as gates, independent of their function as anodes or cathodes. Similarly, the abbreviation BEL is used to denote the backside bias electrode layer.

To provide a framework for the discussion below, an example of a photodiode array is used below in which the frontside doped gate regions have p-type conductivity, the substrate is n-type, and the backside bias electrode layer is, accordingly, a heavily-doped n-type layer. All statements and claims herein are equally true if the conductivity types of all the layers are reversed and the corresponding changes are made to the polarities of the charge carriers, applied voltages and electric fields.

Typically, the gate and bias electrode layers are formed internally to the crystalline semiconductor substrate. They are therefore native to and homostructural with the substrate. In most implementations, an external gate contact, formed from one or more non-native, heterostructural, conducting layers external to the substrate, is formed over a portion of each of the frontside gates. Similarly, one or more non-native, heterostructural, external back contacts may be formed over all, or a portion of, the backside bias electrode layer. In the case of silicon substrates, the gate contacts are usually formed from one or more metals, metal-silicon intermetallic compounds, or deposited, heavily-doped polysilicon, or a combination of a plurality of these materials. In the present context, polysilicon is considered to be both non-native and heterostructural to the crystalline silicon substrate. Similarly, silicon dioxide ($SiO_2$), the amorphous "native oxide" of silicon, is both non-native and heterostructural to the substrate in this context. Back contacts to silicon photodiode arrays may use the same materials or one or more transparent conducting materials such as indium-tin oxide, which is an amorphous typically non-stoichiometric mixture of indium oxide and tin oxide. In many applications, an array of readout circuits is also formed on the front surface of the substrate.

A potential difference, referred to as a reverse bias, can be applied between the gate and the bias electrode layer to produce a depletion region within the substrate extending into the substrate from the p-n junction between the gate on the front side and the substrate. Hence, a photodiode is effected by the gate, the substrate and the BEL. External gate contacts or back contacts are ancillary elements provided to facilitate electrical connections to the photodiode array, not essential components thereof.

Such a photodiode array may be configured either in a frontside-illuminated mode to receive photons from the front side or in a backside-illuminated mode to receive photons from the backside. The frontside-illuminated mode, however, usually results in a lower external quantum efficiency (ratio of photocarriers collected to incident photons) than the backside-illuminated mode, because the conducting elements of the gate contacts and the readout circuits (if provided) reduce the active photosensitive area of the array on the front side. In comparison, the entire back side can be used to collect incoming radiation when properly configured. All other factors being equal, enhanced photosensitivity results in increased signal-to-noise ratio. In single-particle radiation detection applications using either direct (intrinsic) detection in the substrate or indirect detection (e.g., using scintillators as discussed below), enhanced photosensitivity results in improved particle energy resolution. In addition, conducting lines and other physical features such as steps in dielectric thickness on the front side can scatter light into the photosensitive areas of adjacent photodiodes, thereby reducing image contrast. Contrast degradation modifies the modulation transfer function of the array and can reduce the useful spatial resolution of the array. Therefore, backside illuminated photodiode arrays are frequently used in imaging applications to improve photosensitivity, signal-to-noise ratio, particle energy resolution and spatial resolution.

In a backside-illuminated photodiode, photocurrent is typically generated by band-to-band absorption. Photons with energy greater than the bandgap of the semiconductor substrate enter the back of the substrate and are absorbed, producing electron-hole pairs. If an electron-hole pair is generated outside the depletion region of a gate, the minority carrier (a hole in the example above) may diffuse to the edge of the depletion region beneath one of the gates. The electric field within the depletion region "collects" the hole by accelerating it towards the gate. If, however, a photon is absorbed within the depletion region of a gate, the electric field "collects" the hole as above, but accelerates the electron towards the undepleted substrate, or, if the substrate is fully depleted below a gate, towards the backside bias electrode layer. In either case, the photocurrent will flow through the photodiode and the external circuitry that maintains the bias between the gate and the bias electrode layer. If readout circuitry is provided on same semiconductor substrate, the circuit elements associated with each gate will produce a signal that represents a mathematical function of the photocurrent, the quantity of charge caused by the photon absorption, or a combination of both.

In low light-level imaging applications such as night photography, nuclear medical imaging, photon medical imaging, x-ray computed tomography and ballistic photon detection, it is critical for photodiode arrays simultaneously to exhibit high external photon conversion efficiency (defined as the ratio of photocarriers collected to photons incident on the back surface of the substrate) and extremely low reverse-bias leakage currents. For brevity, "quantum efficiency" is used below to denote external photon conversion efficiency, and "leakage current" is used to denote reverse-bias leakage current.

In low light-level imaging systems, the input optical signal often is in the form of short pulses, a few nanoseconds to a few microseconds in duration. For these applications, it is highly beneficial for the photodiodes to have short pulse response times, often referred to collectively as transition times or, singly, as rise and fall times, in the rough order of magnitude range of 10 to 100 ns or less. The signal processing system associated with the photodiode arrays typically "shapes" the output pulse by integrating the photocurrent generated within a time window of fixed duration in the same order of magnitude as the length of the photopulse.

Photodiode arrays with one or more long transition times produce output photocurrent pulses significantly longer than the input photopulse. These long photocurrent pulses produce smaller output pulses from the signal processing electronics than do those from faster photodiode arrays. Therefore, slow photodiode arrays may may result in low output signals from the signal processing electronics and therefore degrade the signal-to-noise ratio of the image.

To achieve high quantum efficiency, the bias electrode layer should be thin enough to be transparent to the incident radiation, yet sufficiently conductive to provide an equipotential surface on the back surface of the substrate adequate to maintain uniform depletion over the entire area beneath each gate.

The bias electrode layer should also have a low density of crystallographic defects and be free from deep-level impurities. If these criteria are met, the BEL will exhibit long enough minority-carrier lifetimes to minimize recombination of photocarriers generated within the BEL, thereby maximizing the efficiency of collection of photocarriers generated therein The BEL will therefore not be an optical "dead layer."

The pulse response times of the photodiodes can be minimized by using semiconductor substrates of high resistivity in the approximate range of 5 to 25 k$\Omega$-cm, operated under reverse bias conditions sufficient to fully deplete the substrate under the gates. Under such full-depletion conditions, the electric field of the depletion region extends to the bias electrode layer on the back side.

Achieving ultra-low leakage current densities, e.g., below about 1 nA/cm$^2$ at room temperature, of the individual photodiodes requires reduction of the contributions to the total leakage current by (1) the substrate; (2) the back contact structure (including the bias electrode layer and any additional layers formed thereon); (3) the front surface regions between the gate regions and between the outer gates and the surrounding regions; and (4) the edges of the substrate, formed when the substrate is "diced" to form individual photodiode array chips.

The bulk generation current of the substrate may be reduced by "gettering," an elevated-temperature process, typically performed at 1000° C. or higher for silicon substrates, in which strained, damaged or heavily-doped layers, singly or in combination, on the back surface of the substrate attract and capture impurities or crystallographic defects. Crystallographic defects may also be annihilated by recombination during the gettering process. The strained, damaged or heavily-doped "gettering layer" or layers is subsequently removed, thereby removing the absorbed impurities and defects. Once the substrate has been gettered, further high-temperature processes should be avoided, to prevent introduction of new impurities or generation of additional defects. All subsequent chemical processing and handling of the substrate should be scrupulously clean to avoid re-contamination.

Front surface generation currents in silicon photodiode arrays are usually minimized by using silicon dioxide (SiO$_2$) layers thermally grown under conditions known to produce low-leakage surfaces. These oxides are typically grown prior to, or concurrently with, the gettering process. Low-temperature (below 400° C.) treatments may be performed after gettering to optimize surface leakage.

Minimizing leakage currents associated with the back contact structure requires dealing with a number of contradictory requirements. As discussed above, the bias electrode layer must be thin enough to be transparent. Such thin layers, however, are easily damaged, and damaged regions may generate leakage current very efficiently. Under fully depleted conditions, the bias electrode layer must be contain enough electrically active (i.e., charged as opposed to neutral) dopant atoms to allow it to terminate the electric field of the depletion region. The back surface of the crystalline semiconductor substrate, or the interface between the substrate and overlayers formed upon the back surface of the substrate to enhance the backside conductivity or to reduce reflection of incident photons, is a region where the crystal structure of the substrate is imperfectly terminated. Such regions may be capable of generating high leakage currents. If the electric field penetrates the BEL and reaches such an interface, it will efficiently collect the current generated there. Similarly, the electric field will collect leakage current generated by impurities or defects within the BEL. Undepleted regions in the BEL typically are highly-doped and will not be efficient leakage generators. Deep level impurities and defects in depleted regions of the BEL, on the other hand, may generate large leakage currents. If the BEL does not exhibit long minority carrier lifetimes, the BEL may therefore degrade the leakage current of the photodiodes.

Edge leakage currents are usually suppressed by providing guard structures surrounding the array of pixels. These structures collect the leakage currents generated at the diced edges before it reaches the pixels themselves.

Guard structures have been developed for a wide variety of applications. In particular, many configurations of guard structures—often referred to as field terminations or, simply, terminations—have been developed to suppress surface breakdown in power semiconductor devices. These terminations typically consist of a series of annular, heavily-doped "field rings", also referred to as guard rings. Frequently, one or more of the field rings is electrically connected to annular, conducting layers overlapping insulating regions adjacent to the guard ring, to control the surface potential of the semiconductor substrate. Such annular conductors are referred to as equipotential rings. Typically, the field rings and associated equipotential rings are passive, floating devices, but some embodiments employ active, biased elements. Biased, conducting layers insulated from the semiconductor substrate are referred to as field plates.

The primary purpose of field termination structures is to control the distribution of the electric field parallel to the front surface of the semiconductor substrate. For brevity, the term horizontal is used below to denote this direction. A well-designed termination generates a relatively uniform horizontal electric field configuration in the spaces between the guard rings. In particular, the termination should reduce the maximum values of the horizontal electric field, thereby suppressing surface breakdown and surface leakage currents.

Other methods of surface breakdown suppression include beveling of the front surface, diced edges, or both; trench etching; surface doping profile modification by ion implantation; and formation of semi-insulating surface regions by ion implantation damage in wide bandgap substrates (e.g., gallium arsenide [GaAs]).

To minimize surface leakage currents, the guard structure for a low leakage current semiconductor photodiode array should be designed in accordance with the same principles as those for power devices. Except for photodiode arrays specifically designed to employ avalanche mechanism as a gain mechanism, low noise photodiode arrays seldom operate at voltages near those that would result in bulk dielectric breakdown as the substrate. As discussed below, however, reducing the size of the guard structure in a photodiode array may result in high horizontal electric fields.

In both power semiconductor devices and low-noise semiconductor photodiode arrays, the field termination structure is ancillary to the primary use of the device. The presence of the guard structure increases the area of the individual dice ["chips"] and therefore reduces the efficiency of utilization of the surface area of the substrate for the primary purpose. In photodiode arrays designed to be assembled, or "abutted", into a mosaic detector comprised of a plurality of photodiode array chips, the guard structure reduces the effective photosensitive area of the mosaic detector. They also introduce optically inactive gaps between the outer photodiodes in adjacent arrays. Unless the spacing of the individual photodiodes in an individual array are purposely positioned far enough apart to match the spacing imposed by the guard structure—thereby further reducing the areal utilization efficiency—the presence of the guard structure causes spacing of the pixels in the mosaic detector to be non-uniform. Non-uniform pixel spacing complicates image analysis and detracts from the image quality of the detector.

Therefore, in semiconductor photodiode arrays, it is highly desirable to minimize the area occupied by the guard structure. Despite the low electric fields present in the depletion regions of the individual photodiodes, the guard structure must be designed carefully to avoid high electric fields and the associated high surface leakage currents.

The magnitude of the edge generation currents injected into the semiconductor chip must be considered in the design of the guard structure for the photodiode array. All other factors being equal, larger edge generation currents result in larger currents collected by the guard structure. For brevity, the current collected by the guard structure is referred to below as the internal guard current. Typically, some fraction of the internal guard current may flow through circuit elements common to the current paths of the guard structure and the individual photodiode pixels. These circuit elements may be parasitic elements internal to the photodiode array chip, parasitic elements associated with contacts and wires in the external circuitry, intentional circuit components, or combinations of a plurality of elements of any of these types. For brevity, the term "guard current" is used below to denote the portion of the internal guard current flowing through these common elements. The noise generated in the common elements by the guard current increases monotonically with the guard current—frequently proportionally to the square root of the guard current. Ceteris paribus, larger edge generation currents result in a higher noise level in the image and lower image quality.

A single guard structure may incorporate one or more passive regions that suppress edge currents by, for example, recombination of minority carriers, and one or more active regions that collect minority carriers injected from the diced edge. In such structures, the internal guard current collected by an active region may be reduced by increasing the distance between the active region and the diced edge. All other factors being equal, in totally passive guard structures, reduction in the proportion of the edge generation current collected by the outer photodiode pixels in the array can be accomplished only by increasing the distance between the outer pixels and the edge of the chip. Increasing the distance of the active guard regions or the outer pixels from the diced edge increases the area occupied by the guard structure, with the associated deleterious effects discussed above.

Therefore, what is needed is a method to reduce the gross generation current injected into the substrate by the edges of the photodiode array chip, thereby facilitating a reduction in the area occupied by the guard structure, with the associated performance benefits implied by the preceding discussion.

SUMMARY

The present invention comprises a passive mechanism for suppressing injection, into any active guard regions interposed between the edge of the photodiode array chip and the outer photodiode pixels or into the outer pixels themselves, of minority carrier current generated in the physically disrupted region at the edge of the semiconductor die created by cleaving, sawing or otherwise separating the chip from the remainder of the wafer on which the die was fabricated. In the present invention, a thin metallic layer covers all or part of the edge region, thereby creating a Schottky barrier. This barrier generates a depletion region in the adjacent semiconductor material. The depletion region inherently creates an energy band distribution which preferentially accelerates minority carriers generated or near the metal-semiconductor interface towards the metal, thereby suppressing collection of these carriers by any active regions of the guard structure or by the photodiode pixels. In some embodiments, the metal layer may be converted into a conducting metal-semiconductor intermetallic compound by chemical reaction with the semiconductor substrate. This reaction may be induced by thermal processing, rapid thermal processing, laser processing, or other means. The intermetallic compound/semiconductor couple, if formed, will produce a Schottky barrier, with the benefits discussed above. Deposition of the metal layer and formation of the metal-semiconductor intermetallic compound, if formed, may be performed at low temperatures (less than a maximum of about 600 to 650° C., but more typically less than about 300° C., for thermal processing; higher global or local temperatures may occur for brief time intervals of a few nanoseconds to a few seconds in laser or rapid thermal processing) that preclude re-contamination of the bulk substrate and "loss of gettering."

Secondary benefits of this technique are (1) it simultaneously reduces the sensitivity of the device to environmental influences and (2) it reduces the parasitic series resistance of indirect back surface contact structures (Carlson, et al., U.S. patent application Ser. No. 09/607,547, filed Jun. 29, 2000) that use the undepleted substrate material in the vicinity of the edge of the chip to provide a resistive connection between the front and back surfaces of the die.

DESCRIPTION OF DRAWINGS

These and other features and advantages of the invention will become more apparent upon reading the following detailed description and upon reference to the accompanying drawings.

DETAILED DESCRIPTION OF THE INVENTION

In one embodiment of the present invention, a metal or conducting, metal-semiconductor intermetallic compound film is formed on the edge of a back-illuminated semiconductor photodiode array die to create a metal-semiconductor (Schottky) barrier structure with a high Schottky barrier height on the semiconductor substrate material. In a preferred implementation, formation of the metal does neither significantly increases the number of process steps required to fabricate the photodiode array nor subjects the photodiode array chip to elevated temperature-time cycles of sufficient duration to cause bulk contamination of the semiconductor substrate.

Figure 1:
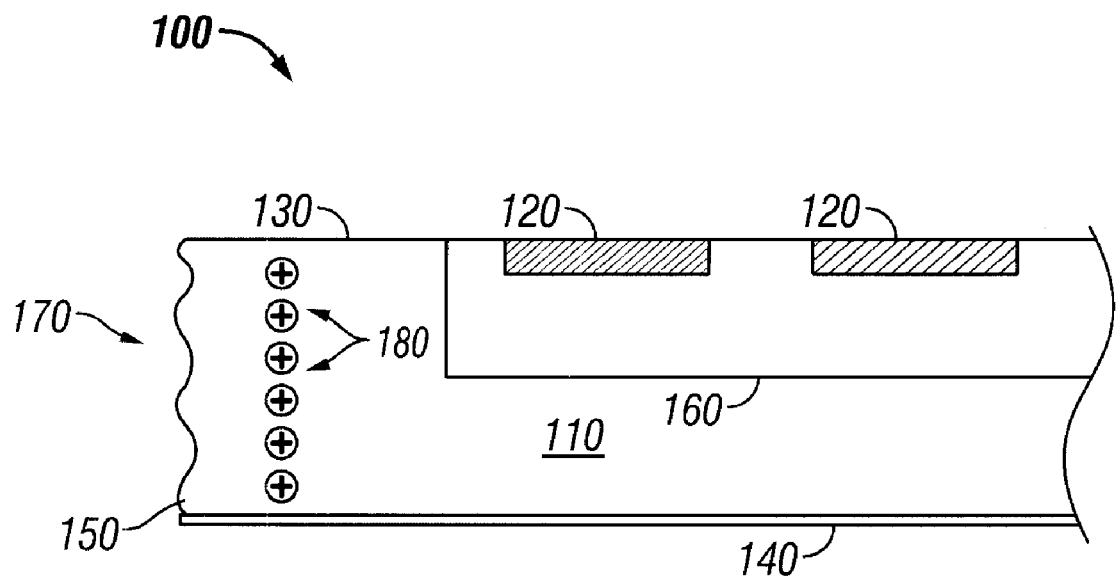
FIG. 1 illustrates a cross-section of a semiconductor photodiode structure prior to formation of a metallic layer covering a portion of the edge region to suppress edge leakage current injection according to one embodiment of the invention.

FIG. 1 depicts a cross-section through a semiconductor photodiode array structure 100. A substrate 110 has a first conductivity type (by way of example, n-type). Heavily-doped gate regions 120 of a second, opposite conductivity type (p-type in this example) are formed within the substrate 110 near the front surface 130. A bias electrode layer 140 of the first conductivity type is formed within the substrate 110 near its back surface 150. A suitable electrical bias potential (positive in this example) may be applied to the bias electrode layer 140 relative to the gate regions 120, producing a plurality of depletion regions 160 beneath the individual gate regions. In a typical design, the size and spacing of the gate regions is such that the individual depletion regions 160 will merge into a single, continuous depletion region as shown, at the operating bias of the array. Thus a photodiode is effected by a gate region 120, the substrate 110 beneath the gate region 120, and the bias electrode layer 140.

Following dicing, the substrate 110 is terminated by one of more edges 170. Minority carriers (holes in this example) 180 generated in the disrupted region near the edge 170 may diffuse to the outer portions of the depletion region 160 of one of the photodiode pixels and be collected by the pixel.

Figure 2:
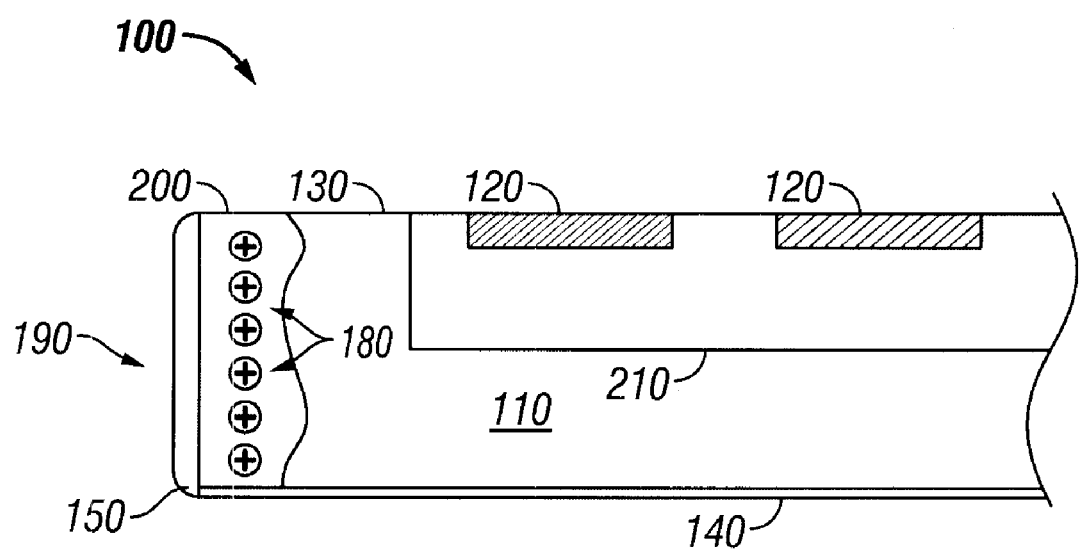
FIG. 2 illustrates a cross-section of a semiconductor photodiode array structure having a metallic layer covering a portion of the edge region according to one embodiment of the invention.

FIG. 2 illustrates an improved semiconductor photodiode array 200 with reduced edge leakage current injection, according to one embodiment of the present invention. Injection of edge generation current into the substrate 110 is suppressed by a metal layer 190 formed over the diced edge 170 of FIG. 1. The metal layer 190 may have been converted into a conducting, intermetallic layer by reaction with the substrate 110 following formation of the metal layer 190 over the diced edge 170. This conversion may be performed by thermal reaction, rapid thermal processing, laser processing or other, macroscopically low-temperature method. The metal or intermetallic layer 190 forms a Schottky barrier with the substrate 110, creating a depletion region 210 within the substrate 110.

The Schottky barrier structure suppresses injection of edge generation current into the substrate outside the depletion region 210 of the Schottky barrier. Minority carriers (holes in this example) 180 generated within the substrate 110 at or near the location of the original diced edge 170 are accelerated toward the metal or intermetallic layer 190 by the electric field of the depletion region 210 of the Schottky barrier. The current associated with the motion of these charge carriers flows in the Schottky diode structure effected by the metal or intermetallic layer 190, the bias electrode layer 140 and the substrate 110. It therefore flows in an internal current loop and is not detectable by the external circuitry used to detect the image from the photodiode array.

The process used to deposit the metal film should have a high yield. One such embodiment employs displacement plating, frequently referred to as immersion plating, to form a thin metal by replacing atoms of the substrate material with metal atoms in a chemical reaction not requiring the application of external electrical potentials. In immersion plating, deposition of the metal film is dependent on the supply of substrate atoms on the outer surface of the film itself. Therefore the growth of the metal film is self-limiting, and only thin layers can be grown by this method. The present invention requires only a thin, continuous conductive film. Autocatalytic electroless deposition [AED] may be employed, however, if thicker layers are desired. In AED, the metal layer is deposited by a chemical reaction that, once initiated, releases a by-product that catalyzes further deposition of the metal. Therefore, AED may be used to deposit films of any thickness.

In the case of n-type silicon substrates, platinum (Pt) and palladium (Pd) are excellent choices for the metal layer. Both metals exhibit high Schottky barrier heights (Pt, 0.90 eV; Pd, 0.81 eV) on n-type Si, and both can be deposited directly on Si by immersion plating. In addition, both Pt and Pd form conducting, intermetallic compounds with silicon at low temperatures. PtSi and $Pd_2Si$ may be formed at low temperatures (roughly 300° C. or lower) and form stable Schottky barriers on Si. PtSi and $Pd_2Si$ have Schottky barrier heights of 0.84 and approximately 0.74 eV on n-type Si. Although these are lower than the barrier heights of the unreacted metals, formation of the intermetallic compound consumes the original metal-silicon interface. Contaminants at the interface become trapped in the compound phase, and in addition some of the damaged layer near the interface is consumed. Thus formation of the intermetallic layer performs a low-temperature local surface gettering function. The compound/Si contact is highly stable.

If the semiconductor substrate is p-type, the metals of choice are those with a low Schottky barrier height on the n-type semiconductor. In the case of p-type Si, metals such as titanium (Ti) and aluminum (Al) are suitable. Low barrier height intermetallics such as hafnium silicide (HfSi) and zirconium silicide ($ZrSi_2$) form at higher temperatures (550 to 600° C.) than PtSi and $Pd_2Si$ and are therefore not as attractive.

This procedure may be performed immediately after dicing of the substrate. During dicing, the back surface 150 of the substrate 110 may be protected by a film of conventional dicing tape, frequently used to support and anchor the substrate during dicing. The front surface 130 of the substrate may be protected by a layer of photoresist. Photoresist is commonly used for front surface protection during dicing. Protection of the front surface 130 and back surface 150 against attack during the plating process therefore may not require any additional process steps. Following dicing, the particles shed from the substrate, the photoresist and the dicing tape may be blown or rinsed away using normal semiconductor processing procedures. The diced edges 170 of the individual photodiode arrays may be lightly etched with a dilute, buffered or non-buffered, solution of hydrofluoric acid or mild silicon etch to remove surface oxides or a portion of the disrupted edge region. The etching solution, if used, may be flushed away and the photodiode arrays rinsed in deionized water and dried.

The photodiode array chips may then be flooded with the immersion plating solution. Following metal plating, the plating solution may be flushed away and the photodiode arrays rinsed in deionized water and dried. Demounting of the completed, edge-plated arrays from the dicing tape and removal of the photoresist layer may be performed using conventional techniques. If desired, the metal film may be converted into a conductive, intermetallic layer by thermal reaction or other methods as discussed above.

In addition to suppressing edge generation current injection into the semiconductor substrate, this invention has additional, beneficial effects on the photodetector array structure. A metal film, and especially a conducting, intermetallic film, seals the entire surface created during dicing of the substrate against external liquids, gases, contamination and other environmental factors. This invention, therefore, increases the stability of the photodiode array structure relative to environmental effects. In addition, in photodiode array structures using an indirect back surface contact, the metal or intermetallic film provides a conductive path between the heavily-doped "moat" contact on the front surface of the substrate and the heavily-doped bias electrode layer on the back surface of the substrate. This path is in parallel with the resistance of the undepleted substrate region between the moat and the bias electrode layer. Therefore this invention reduces the parasitic series resistance inherent in the indirect back surface contact structure, thereby reducing the contribution of this parasitic resistance to the noise output of the photodiode array.

This method of edge generation current suppression has been demonstrated in 16-element (4×4 pixels) photodiode arrays fabricated in high-resistivity (rough order of magnitude 5 to 25 kΩ-cm) n-type silicon substrates. Thin films of metallic Pt were formed by immersion plating from aqueous solutions at room temperature.

A number of embodiments of the invention have been described. Nevertheless, it will be understood that various modifications may be made without departing from the spirit and scope of the invention. Accordingly, other embodiments are within the scope of the following claims.

What is claimed is:

1. A device, comprising:
    A semiconductor substrate;
    a gate region, in said semiconductor substrate, and having a gate structure to form a first depletion region in said semiconductor substrate adjacent said gate region, when biased; an edge which is formed by dicing; and
    an edge structure, coupled to said edge formed by dicing, and forming a second depletion region in an area of said edge formed by dicing.

2. A device as in claim 1, wherein said second depletion region formed by said edge structure is effective to prevent minority carriers from traveling to said first depletion region.

3. A device as in claim 1, wherein said structure includes a metal layer covering the edge formed by dicing.

4. A device as in claim 3, wherein said metal layer forms a Schottky barrier with the substrate.

5. A device as in claim 1, wherein said gate structure includes two spaced gates which form a continuous depletion region in an area adjacent to said two spaced gates.

6. A device as in claim 3, wherein said metal includes a bimetallic part.

7. A device as in claim 3, wherein said metal is a metal which forms a Schottky barrier height of at least 0.74 electron volts.

8. A device as in claim 1, further comprising structure in said semiconductor substrate forming a photodiode portion.

9. A device as in claim 8, wherein said structure forms an array of photodiodes.

10. A device as in claim 8, further comprising a rear biasing contact, formed on an opposite surface to a surface of said gate region.

11. A photo diode array, comprising:
    a semiconductor substrate having at least one gate region on a first surface thereof, and a biasing electrode on a second opposite surface thereof, opposite to said first surface, said gate region and said biasing electrode being formed to create a depletion region near said gate region when biased by said biasing electrode, said semiconductor substrate also having at least one diced edge thereon; and
    a second depletion layer forming region, coupled to said diced edge, and forming a second depletion region in an area near said diced edge, said second depletion region being effective to prevent minority carriers from said diced edge from traveling to said first depletion region.

12. A photo diode array as in claim 11, wherein said second depletion layer forming region includes a metal structure which is coupled to said diced edge.

13. A photo diode array as in claim 11, wherein said metal structure includes an intermetallic layer.

14. A photo diode array as in claim 11, wherein said metal structure is formed of a material from the group consisting of platinum or palladium.

15. A photo diode array as in claim 11, wherein said at least one gate region includes a plurality of gate regions which are spaced from one another, but which are effective to form a single first depletion region adjacent said plurality of the lawyers.

16. A photo diode array as in claim 11, wherein said second depletion layer forming region forms a Schottky barrier with the substrate.

17. A photo diode arrary as in claim 16, wherein said metal has a Schottky barrier height of at least 0.74 electron volts.

* * * * *